Figure 1:
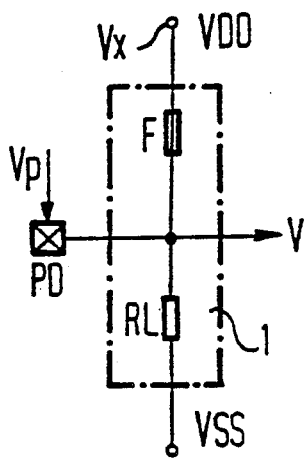

United States Patent [19]

Pribyl

[11] Patent Number: 5,124,587
[45] Date of Patent: Jun. 23, 1992

[54] INTEGRATED CIRCUIT WITH A CONFIGURATION CIRCUIT

[75] Inventor: Wolfgang Pribyl, Graz, Austria

[73] Assignee: Siemens Aktiengesellschaft, Munich, Fed. Rep. of Germany

[21] Appl. No.: 547,605

[22] Filed: Jun. 28, 1990

[30] Foreign Application Priority Data

Jun. 30, 1989 [EP] European Pat. Off. ........ 89111980.2

[51] Int. Cl.⁵ .......................................... H03K 19/003
[52] U.S. Cl. .................................. 307/465; 307/202.1
[58] Field of Search ............... 307/202.1, 443, 465, 307/468, 469, 272.2, 272.3; 365/189.03, 225.7, 238.5

[56] References Cited

U.S. PATENT DOCUMENTS

| | | |
|---|---|---|
| 4,730,129 | 3/1988 | Kunitoki et al. ............. 307/202.1 X |
| 4,833,650 | 5/1989 | Hirayama et al. ................ 365/225.7 |
| 4,837,520 | 6/1989 | Golke et al. .................. 365/225.7 X |
| 4,860,256 | 8/1989 | Devin et al. .................... 365/189.03 |
| 4,906,862 | 3/1990 | Itano et al. ................. 365/189.03 X |
| 4,908,525 | 3/1990 | Yung ................................ 307/202.1 |
| 4,922,134 | 5/1990 | Hoffmann et al. ........... 307/202.1 X |

OTHER PUBLICATIONS

Tolley et al., "72-K RAM stands up to soft and hard errors", *Electronics*, Jun. 1982, pp. 147-151.

*Primary Examiner*—David Hudspeth
*Attorney, Agent, or Firm*—Herbert L. Lerner; Laurence A. Greenberg

[57] ABSTRACT

An integrated circuit configuration includes a configuration circuit with a potential lead and a connection device for a control potential. An electronic circuit connects the connection device to the potential lead.

16 Claims, 1 Drawing Sheet

INTEGRATED CIRCUIT WITH A CONFIGURATION CIRCUIT

The invention relates to an integrated circuit configuration, having a configuration circuit with a potential lead, and connection means for a control potential.

Modern integrated semiconductor circuits are often constructed in such a way that they can be operated in principle in at least two different operating modes. For instance, some integrated semiconductor memories are constructed to be drivable in what are known as the nibble mode or the page mode. Another variant offers the option of selecting between various forms of organization of semiconductor memories. With a 16 megabit memory, for instance, a selection can be made as to whether it is to be operable in the 16 megabit × 1 bit data width organization form, or the 4 megabit × 4 bit data width form. Setting of the selection, i.e. the configuration, is irreversibly accomplished by the manufacturer of the semiconductor circuits, generally in the manufacturing phase or before installation of the chip of the semiconductor circuit in a housing. In order to accomplish this, a lead pad which is especially provided on the semiconductor chip can, for instance, either remain unwired or be connected with one of the supply potential leads.

However, configuration circuits are also known for the same purpose, which typically include an interruptible "laser fuse" or a special, likewise interruptible, conductor track for selection of the desired configuration. In this way, a so-called configuration signal is generated during operation which then selects the mode chosen for the entire semiconductor circuit.

However, in order to be able to test the entire semiconductor circuit in all of its configuration states, connection means (often constructed as a lead pad, although a special conductor track for mounting a test probe, or a configuration for coupling in a beam of light, are also possible) are usually also provided, for applying a control potential in such a testing situation.

A corresponding generic integrated circuit configuration having a configuration circuit and connection means are shown in the drawings and described below. However, a disadvantage of such a device is that when the control potential is applied, and depending on its potential value, a high current flows through the laser fuse (or the interruptible conductor track, depending on the embodiment) to a supply potential of the configuration circuit.

It is accordingly an object of the invention to provide an integrated circuit configuration, which overcomes the hereinafore-mentioned disadvantages of the heretofore-known devices of this general type and which improves a generic integrated circuit configuration in such a way that when the control potential is applied, only a slight flow of current occurs in each case.

With the foregoing and other objects in view there is provided, in accordance with the invention, an integrated circuit configuration, comprising a configuration circuit with a potential lead, connection means for a control potential, and an electronic circuit for connecting the connection means to the potential lead.

In accordance with another feature of the invention, the electronic circuit includes a load element having one lead connected to the connection means as well as to the potential lead and having another lead connected to a supply potential.

In accordance with a further feature of the invention, the electronic circuit is connected between the connection means and the potential lead; and the electronic circuit includes at least one series-connected pair of inverters each having an input and an output, a capacitance connected between the output of the first inverter and a first supply potential, and a transistor being connected between the output of the second inverter and the input of the first inverter and having a gate connected to the first supply potential.

In accordance with an added feature of the invention, the transistor has a channel type preventing a voltage drop at the level of its cutoff voltage from occurring in the electrically conducting state whenever the first supply potential is present at its gate and a potential different from the first supply potential is present at its source.

In accordance with an additional feature of the invention, the electronic circuit is connected between the connection means and the potential lead, the connection means receives a control potential, the electronic circuit includes a flip-flop having an inverting output connected to the potential lead and non-inverting output not connected to the potential lead, and the flip-flop has an electrical preferential position causing the non-inverting output to have a state equal to a first supply potential when a supply voltage is switched on and the control potential is not applied to the connection means.

In accordance with yet another feature of the invention, the flip-flop includes two antiparallel-connected inverters having switching times of different lengths.

In accordance with yet a further feature of the invention, the inverters are CMOS inverters.

In accordance with yet an added feature of the invention, one of the switching times is at most one-half as long as the other of the switching times.

In accordance with yet an additional feature of the invention, the flip-flop has an input side, and there is provided a capacitance connected between the input side of the flip-flop and the supply potential.

In accordance with a concomitant feature of the invention, the capacitance is a varactor or a capacitor.

Other features which are considered as characteristic for the invention are set forth in the appended claims.

Although the invention is illustrated and described herein as embodied in an integrated circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of a configuration according to the prior art; and FIGS. 2-5 are schematic and block circuit diagrams of various embodiments of the invention.

Referring now to the figures of the drawings in detail and first, particularly, to FIG. 1 thereof, there is seen a prior art device that will be explained first, having a configuration circuit 1 which, for instance, includes a laser fuse F and a load resistor RL connected in series therewith. Both the laser fuse F and the load resistor RL are connected between two potentials, that are typically supply potentials of an integrated semiconductor circuit, within which the configuration circuit 1 is disposed. A potential lead to which the laser fuse F is connected is indicated with reference numeral Vx. A configuration signal V having a value which depends on whether or not the laser fuse F is cut, is produced at a common connecting point of the laser fuse F and the load resistor RL. Connection means PD for a control potential Vp are also connected to the common connecting point (and thus to the configuration signal V). The control potential Vp is not present during normal operation, but it is present in test operation. In a first test situation, the control potential Vp has the same value as a potential VDD to which the laser fuse F is connected. In that case, no current flow occurs through the laser fuse F, but there is a small current flow through the typically high-impedance load resistor RL. However, in a second test situation, the control potential Vp has the same value as a potential VSS to which the load resistor RL is connected. Thus, although there is no flow of current through the load resistor RL, there is a very high flow of current through the laser fuse F, because the fuse is typically constructed for low impedance.

In contrast, according to the invention as shown in FIGS. 2-5, an electronic circuit 2 connects the connection means PD to the potential lead Vx of the configuration circuit 1 (which may be a laser fuse F, as already described, or some element operating in the same way, such as an interruptible conductor track, may also be connected to the potential lead Vx of the configuration circuit 1). This assures that a high current flow through the laser fuse F and thus through the connection means PD cannot occur under any conditions in the unsevered state of the laser fuse F.

Figure 2:
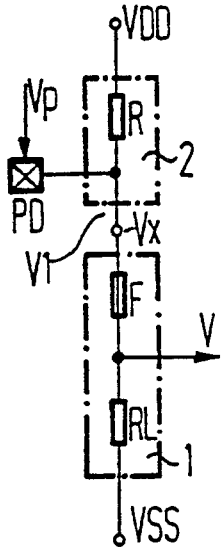

In the embodiment of FIG., 2, the electronic circuit 2 includes a load element R. On one hand, the element R is connected to a supply potential VDD and on the other hand it is connected to both the potential lead Vx of the configuration circuit 1 and the connection means PD. During operation, the result is an auxiliary potential V1 at the potential lead Vx. The auxiliary potential has approximately the same value as the supply potential VDD during normal operation (when no control potential Vp is present). However, if the control potential Vp is present at the connection means PD (that is, in the test situation), then the auxiliary potential V1 is equal to the control potential Vp. The load element R can be provided in various ways, for example as an ohmic resistor or as a transistor connected as a resistor. The configuration circuit 1 is the same as in FIG. 1. In the embodiment of FIG. 2, care should be taken to ensure that although the load element R is constructed with high impedance, it is nevertheless of lower impedance than the load resistor RL, so that during normal operation an auxiliary potential V1 can be established that only differs slightly in value from the supply potential VDD (an ohmic voltage divider is formed of the load element R, the laser fuse F and the load resistor RL).

Figure 3:
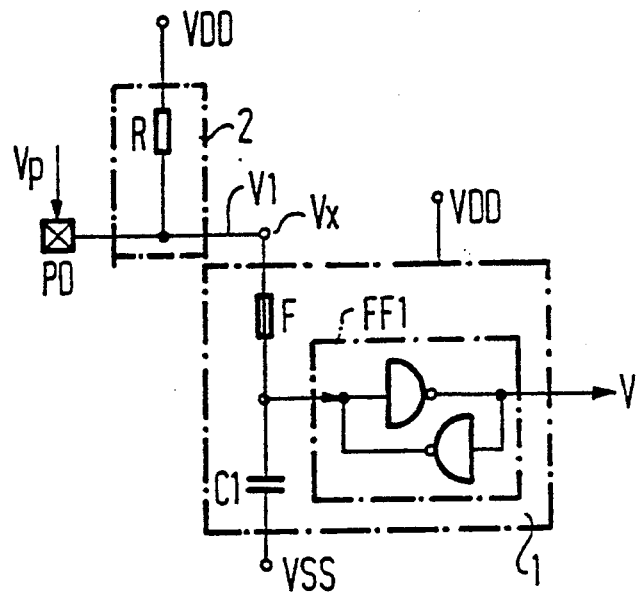

FIG. 3 includes the same electronic circuit 2 as in FIG. 2. However, instead of the load resistor RL of FIGS. 1 and 2, the configuration circuit 1 includes a flip-flop FF1 and a capacitance C1. For information on the mode of operation of the configuration circuit 1, and the resultant configuration signal V, reference is made to co-pending U.S. application Ser. No. 547,608, having the same inventor and filing date as the present application. The contents thereof are hereby incorporated by reference in the present application. Each of the circuit configurations disclosed therein for generating a configuration signal can be used as a configuration circuit 1 in FIGS. 2-5 of the present invention. Further explanation of the configuration circuits 1 of FIGS. 2-5 will therefore be omitted in this case.

Figure 4:
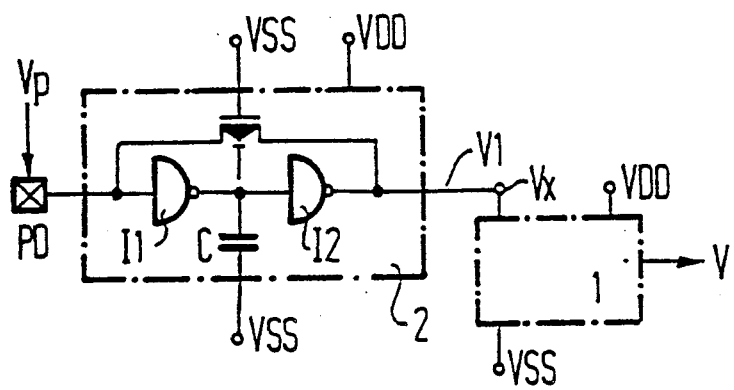

In the embodiment of FIG. 4, the electronic circuit 2 is disposed between the connection means PD and the potential lead Vx. The circuit 2 includes at least one pair of inverters I1, I2 that are connected in series with one another. The output of one inverter I1 is connected through a capacitance C to a first supply potential VSS of the circuit configuration. The output of the other inverter I2 is connected through the source-to-drain path of a transistor T to the input of the first inverter I1. The gate of the transistor T is connected to the first supply potential VSS.

Preferably, the channel type of the transistor T is selected in such a way that in the electrically conducting state no voltage drop occurs along its source-to-drain path at the level of its cutoff voltage $V_{th}$, whenever the first supply potential VSS is applied to the gate, as connected in accordance with the invention, and a potential that is different from the first supply potential VSS is applied to its source. The different potential typically is a second supply potential VDD of the integrated circuit configuration. If it is assumed that the first supply potential VSS is 0 V, as is typically the case, and the second supply potential VDD is typically 5 V, then the transistor T is accordingly of the p-channel type. However, if the polarities of the supply potentials VSS, VDD are reversed (which is not shown but is possible), then the transistor T is accordingly of the n-channel type. The capacitance C is preferably constructed as a capacitor or a varactor.

The electronic circuit 2 functions as follows: In the normal situation, in which there is no control potential Vp present at the connection means PD, the input of the other inverter I2 is initially at the first supply potential VSS because of its capacitive coupling to the first supply potential VSS (this is the "power-on" phase, in which the capacitance C is discharged). Accordingly, an auxiliary potential V1 is established at the potential lead Vx that is equal to the second supply potential VDD. The transistor T is thus electrically conducting and the second supply potential VDD is also present at the input of the first inverter I1. This in turn causes seizing of the input of the other inverter I2 at the first supply potential VSS.

If a control potential Vp which is applied to the connection means PD has a value that is approximately equal to the second supply potential VDD, then the same electrical conditions and states prevail as already described above for the normal situation.

However, if a control potential Vp that is present at the connection means PD has a value equal to the first supply potential VSS, then the auxiliary potential V1 is likewise at that value, which has the same effect with respect to the configuration signal V as if the laser fuse F of the configuration circuit 1 had been cut. The non-illustrated semiconductor circuit triggered by the configuration signal V can then be operated for testing purposes as if a durable change in configuration (analogous to the cutting of the laser fuse F) had taken place. However, in contrast to a durable configuration change produced by means of a laser fuse F, this change in configuration is reversible by changing the control potential Vp or removing the control potential Vp.

Figure 5:
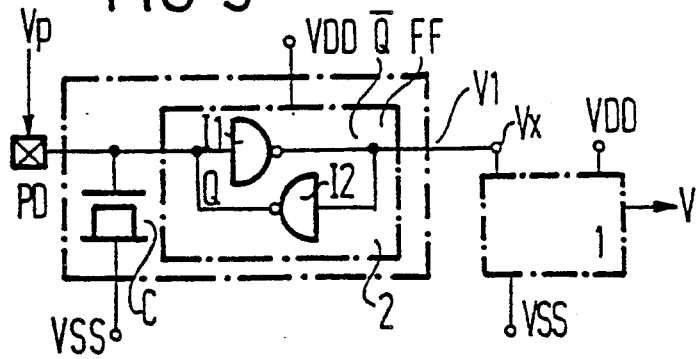

FIG. 5 shows another advantageous embodiment of the invention. In this case, as in FIG. 4, the electronic circuit 2 is disposed between the connection means PD and the potential lead Vx. However, it advantageously includes a flip-flop FF. The flip-flop has a preferential electrical position, which has the effect of giving the non-inverting output Q, which is not connected to the potential lead Vx, an electrical state that is equal to the first supply potential VSS, when the aforementioned first and second supply potentials VSS, VDD are switched on, in the case in which the control potential vp is not present at the connection means PD. Accordingly, the inverting output $\overline{Q}$ of the flip-flop FF has the aforementioned second supply potential VDD. This represents normal operation, in which the state of the configuration signal V depends solely on whether or not the laser fuse F of the configuration circuit 1 is cut.

In order to be able to provide the preferential electrical position, the flip-flop FF preferably has two antiparallel-connected inverters I1, I2, particularly of the CMOS type, which have switching times t1, t2 of different lengths. It is advantageous for the first switching time t1 to be at most half as long as the other switching time t2. The assumption of the preferential position can also be reinforced if the input side of the flip-flop FF is connected through a capacitance C to the first supply potential VSS, as is also shown in FIG. 5. In the case in which no control potential Vp is present at the connection means PD, the value of the configuration signal V is determined solely by the state of the laser fuse F.

If the control potential Vp is present at the connection means PD at a potential value that is equal to the first supply potential VSS, then the auxiliary signal V1 has the value of the second supply potential VDD. In this case again, the value of the configuration signal V is determined solely by the state of the laser fuse F. In the unsevered state of the laser fuse F, the configuration signal V accordingly means that the semiconductor signal connected to it can be operated in its first operating mode.

However, if the control potential Vp is present at the connection means PD with a potential value that is equal to the second supply potential VDD (which is useful only if the laser fuse F is not severed), then the auxiliary potential V1 at the potential lead Vx assumes the value of the first supply potential VSS. In terms of the configuration signal V, this has the same effect as if the laser fuse F were severed. The semiconductor circuit connected to it can thus be operated in its second operating mode (or configuration), but (in contrast to the situation where a laser fuse F is severed) this mode is reversible.

Accordingly, the present invention makes it possible to operate an integrated semiconductor circuit connected to the integrated circuit configuration in various operating modes or configurations, and a change can be made from one mode to another and vice versa, like a circuit configuration according to the prior art. However, there is substantially less current consumption than in the prior art: Although a relatively high current arises (the laser fuse F is known to have relatively low impedance) in the prior art (FIG. 1) when the first supply potential VSS is applied as a control potential Vp through the laser fuse F of the configuration circuit 1, when the same control potential Vp is applied through the load element R of the electronic circuit 2 of FIGS. 2 and 3, a low flow of current occurs, because the load element R has high impedance. In the embodiments of FIGS. 4 and 5 this current flow is even markedly less, because the inverters I1, I2 have a very low input current consumption, as is well known for inverters (in particular those including MOS transistors and especially CMOS inverters). Even with the conducting transistor T in FIG. 4, only a slight current flow occurs, which in this case is determined by the current consumption of the configuration circuit 1 at the potential lead Vx. In this connection, reference is again made to the co-pending U.S. application mentioned above having the same inventor and filing date as the present application.

I claim:

1. Integrated circuit configuration, comprising a configuration circuit with a potential lead, connection means for a control potential, and an electronic circuit for connecting said connection means to the potential lead, wherein said electronic circuit is connected between said connection means and the potential lead; and said electronic circuit includes:

at least one series-connected pair of inverters each having an input and an output, a capacitance connected between the output of said first inverter and a supply potential, and a transistor being connected between the output of said second inverter and the input of said first inverter and having a gate connected to the supply potential.

2. Circuit according to claim 1, wherein said transistor has a channel type preventing a voltage drop at the level of its cutoff voltage from occurring in the electrically conducting state whenever the supply potential is present at its gate and a potential different from the supply potential is present at its source.

3. Circuit according to claim 1, wherein said capacitance is a varactor.

4. Circuit according to claim 1, wherein said capacitance is a capacitor.

5. Circuit according to claim 2, wherein said capacitance is a varactor.

6. Circuit according to claim 2, wherein said capacitance is a capacitor.

7. Integrated circuit configuration, comprising a configuration circuit with a potential lead, connection means for a control potential, and an electronic circuit for connecting said connection means to the potential lead, wherein said electronic circuit is connected between said connection means and the potential lead, said connection means receives a control potential, said electronic circuit includes a flip-flop having an inverting output connected to the potential lead and a non-inverting output not connected to the potential lead, and said flip-flop has an electrical preferential position causing the non-inverting output to have a state equal to a supply potential when a supply voltage is switched on and the control potential is not applied to said connection means.

8. Circuit according to claim 7, wherein said flip-flop includes two antiparallel-connected inverters having switching times of different lengths.

9. Circuit according to claim 8, wherein said inverters are CMOS inverters.

10. Circuit according to claim 8, wherein one of the switching times is at most one-half as long as the other of the switching times.

11. Circuit according to claim 9, wherein one of the switching times is at most one-half as long as the other of the switching times.

12. Circuit according to claim 7, wherein said flip-flop has an input side, and including a capacitance connected between the input side of said flip-flop and the supply potential.

13. Circuit according to claim 12, wherein said capacitance is a varactor.

14. Circuit according to claim 12, wherein said capacitance is a capacitor.

15. Integrated circuit configuration, comprising a configuration circuit with a potential lead, connection means for a control potential, and an electronic circuit for connecting said connection means to the potential lead, wherein said electronic circuit is connected between said connection means and the potential lead, and said electronic circuit includes a flip-flop and a capacitance connected between the flip-flop and a supply potential.

16. Circuit according to claim 15, wherein said flip-flop includes two antiparallel-connected inverters.

* * * * *